US 11,585,863 B2

(12) United States Patent
Bogert et al.

(10) Patent No.: US 11,585,863 B2
(45) Date of Patent: Feb. 21, 2023

(54) CAPACITIVE PICKUP FAULT DETECTION

(71) Applicant: AVO Multi-Amp Corporation, Dallas, TX (US)

(72) Inventors: Charles Bogert, West Chester, PA (US); Andrew Sagl, Limerick, PA (US)

(73) Assignee: AVO Multi-Amp Corporation, Dallas, TX (US)

( * ) Notice: Subject to any disclaimer, the term of this patent is extended or adjusted under 35 U.S.C. 154(b) by 169 days.

(21) Appl. No.: 17/175,195

(22) Filed: Feb. 12, 2021

(65) Prior Publication Data

US 2022/0260648 A1 Aug. 18, 2022

(51) Int. Cl.
*G01R 31/52* (2020.01)
*H02H 3/33* (2006.01)

(52) U.S. Cl.
CPC .............. *G01R 31/52* (2020.01); *H02H 3/33* (2013.01)

(58) Field of Classification Search
CPC .................................. G01R 31/52; H02H 3/33
USPC .......................................................... 361/42
See application file for complete search history.

(56) References Cited

U.S. PATENT DOCUMENTS

| 2003/0194672 | A1 | 10/2003 | Roberts et al. | |
| 2009/0322358 | A1* | 12/2009 | Imaizumi | G01R 27/02 324/713 |
| 2010/0290164 | A1 | 11/2010 | Kinsel | |
| 2012/0019965 | A1* | 1/2012 | Faxvog | H02H 3/52 361/627 |

FOREIGN PATENT DOCUMENTS

| CN | 102353843 A | * | 2/2012 | |
| JP | 02275373 A | | 11/1990 | |
| KR | 20050045468 A | | 5/2005 | |
| WO | 2014154164 A1 | | 10/2014 | |
| WO | WO-2014154164 A1 | * | 10/2014 | ........... G01R 15/142 |

OTHER PUBLICATIONS

Machine Translation of Li et al. International Patent Document WO 2014/154164 A1 Oct. 2, 2014 (Year: 2014).*
Machine Translation of Dong et al. Chinese Patent Document CN 102353843 A Feb. 15, 2012 (Year: 2012).*
PCT International Search Report & Written Opinion of the International Searching Authority; PCT/US2022/016134; dated May 13, 2022; 9 pages.

* cited by examiner

*Primary Examiner* — Kevin J Comber
(74) *Attorney, Agent, or Firm* — Conley Rose, P.C.; J. Robert Brown, Jr.

(57) ABSTRACT

A system for ground fault detection includes an alternating current (AC) excitation source configured to provide an AC test signal to a circuit under test; a current transformer configured to detect a current of the AC test signal; a capacitive pickup configured to detect a voltage of the AC test signal; and a receiver which includes a display; and a processor configured to receive the voltage from the capacitive pickup; receive the current from the current transformer; and display on the display one or more components of the current.

8 Claims, 11 Drawing Sheets

Section A-A

CAPACITIVE PICKUP FAULT DETECTION

CROSS-REFERENCE TO RELATED APPLICATIONS

None.

BACKGROUND

Electrical power systems generate three-phase alternating current (AC) electrical power. Each power phase is 120 degrees out of phase, plus or minus, with the other two power phases. The voltage of any phase oscillates sinusoidally between positive voltage and negative voltage. It is more efficient to transmit electrical power at high voltage levels than at low voltage levels. Electrical power may be generated as three-phase AC power at moderate voltage levels in the 12 thousand volt (kV) to 25 kV range. The voltage level may be stepped up to the 110 kV to 1000 kV range using a transformer for transmission over long transmission lines, in order to decrease transmission line power loss. The transmission line voltage may be stepped down, using a transformer at a substation, to the 12 kV to 35 kV range for local distribution. The local distribution voltage level may be further stepped down through one or more transformer stages to provide 120 volt AC power to the home and office.

Power substations and data centers or other power consumers will have backup power that is based upon batteries. These stationary battery installations provide power when the power from the AC power grid is interrupted. The battery installations consist of a number of series connected cells that are isolated from ground to provide a level of fault tolerance. A single fault to ground does not interfere with the continued delivery of power to the loads. However, a second fault to ground typically results in a short circuit across the battery string which is then cleared by a circuit breaker or fuse and results in loss of power to a connected load.

SUMMARY

Described herein is a system and method for ground fault tracing using a capacitive pickup remote from an AC excitation source. In a battery backup system with a short to ground, a capacitive pickup may be used in conjunction with a current transformer to detect the location of the short to ground. An AC excitation source may be connected to the circuit with the short to ground. The capacitive pickup is attached to the circuit at a point remote from the AC excitation source to provide a synchronization (sync) signal to a receiver device used in identifying test currents in the circuit. The capacitive pickup and current transformer may be repositioned at various points in the circuit until the short is located. Some approaches require a physical connection from the AC excitation source to a meter, e.g. the receiver, used in detecting the short. The capacitive pickup described herein provides the sync signal and removes the requirement of a physical connection to the AC excitation source. These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

Described herein is a system and method for using a capacitive pickup in ground fault detection. As used herein, ground fault detection includes identifying that a ground fault is present in a circuit and determining the location of the ground fault. A ground fault occurs when current in a circuit unintentionally flows to ground. Ground faults may have various causes including, but not limited to, worn or frayed shielding or insulation of a wire, improperly wired loads, etc. While several embodiments described herein relate to ground fault detection in a battery backup system, the capacitive pickup may be used in other applications involving detection of a fault in a circuit using a synchronization (sync) signal. Further, the capacitive pickup may be used to sense an AC voltage in any application where an AC voltage is applied on a wire in a circuit.

Figure 1A:
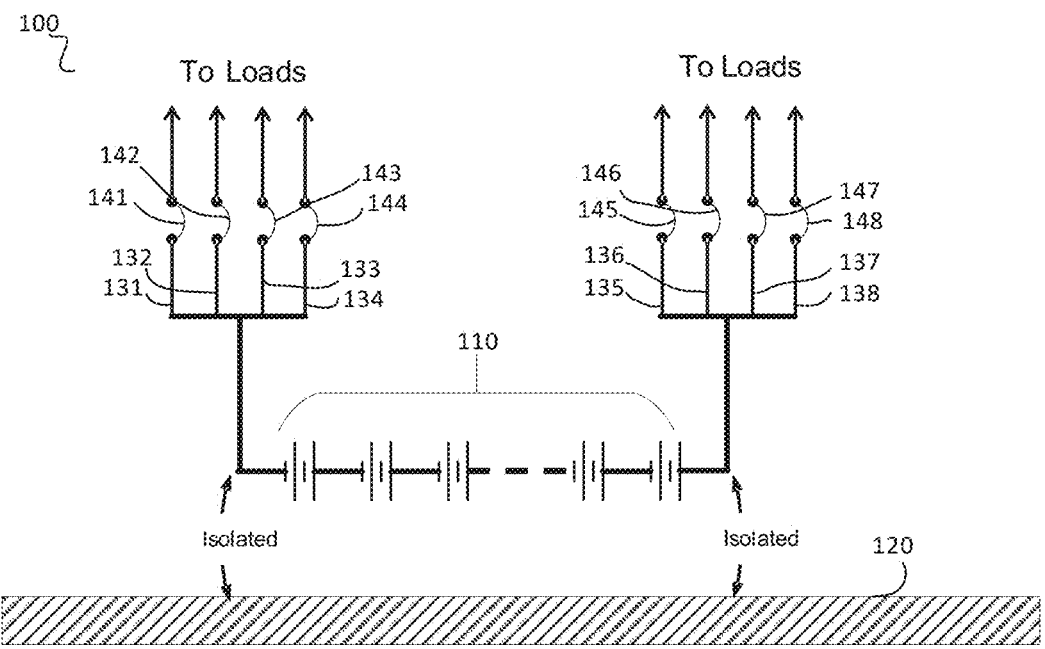
FIGS. 1A, 1B, and 1C are a diagram of an embodiment of a battery backup system with ground faults.

FIG. 1A is a diagram of an embodiment of a battery backup circuit 100. The battery backup circuit 100 may be installed at utility substations or on premises where backup power is required, for example data centers or telecommunications hubs. The battery backup circuit 100 includes a battery string 110. The battery string 110 includes one or more cells connected in series. The one or more cells of the battery string 110 may be any type of cell capable of storing a charge for use by loads (not pictured) connected to the battery backup circuit 100. Each cell may provide between one and four volts direct current (DC). Based upon the type of cell selected the voltage provided by the cells may vary. The DC voltage provided by the battery string may vary based upon the application of the battery string. The DC voltage may range from 12 volts DC to as much as several hundred volts DC. The ampere-hour rating of the battery string may be selected based upon the attached load in the circuit.

Figure 1B:
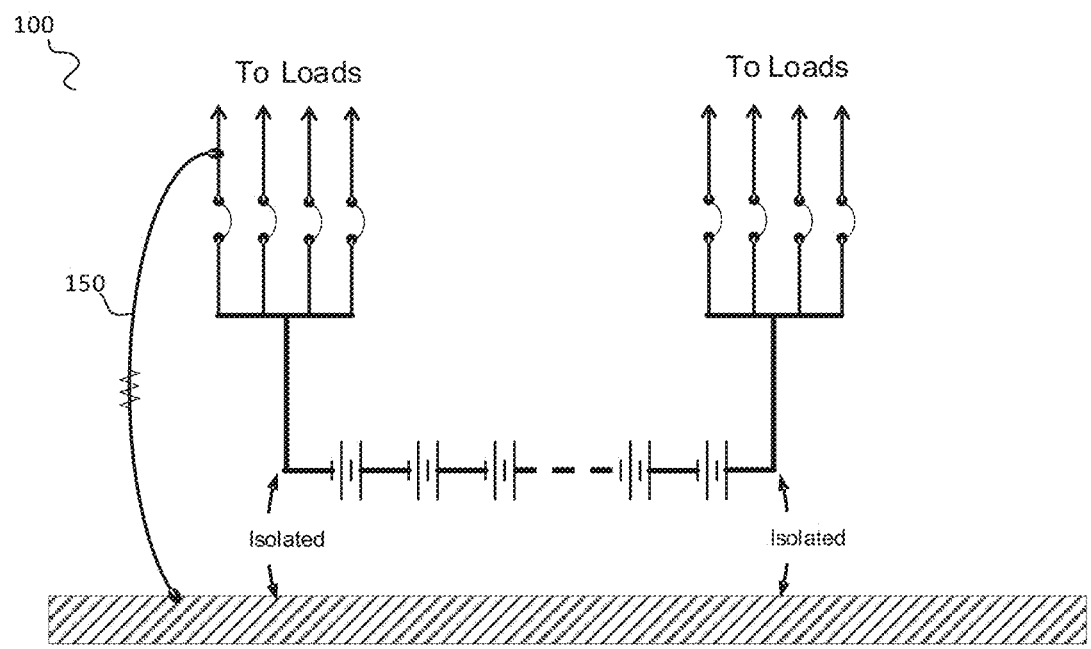
Figure 1C:
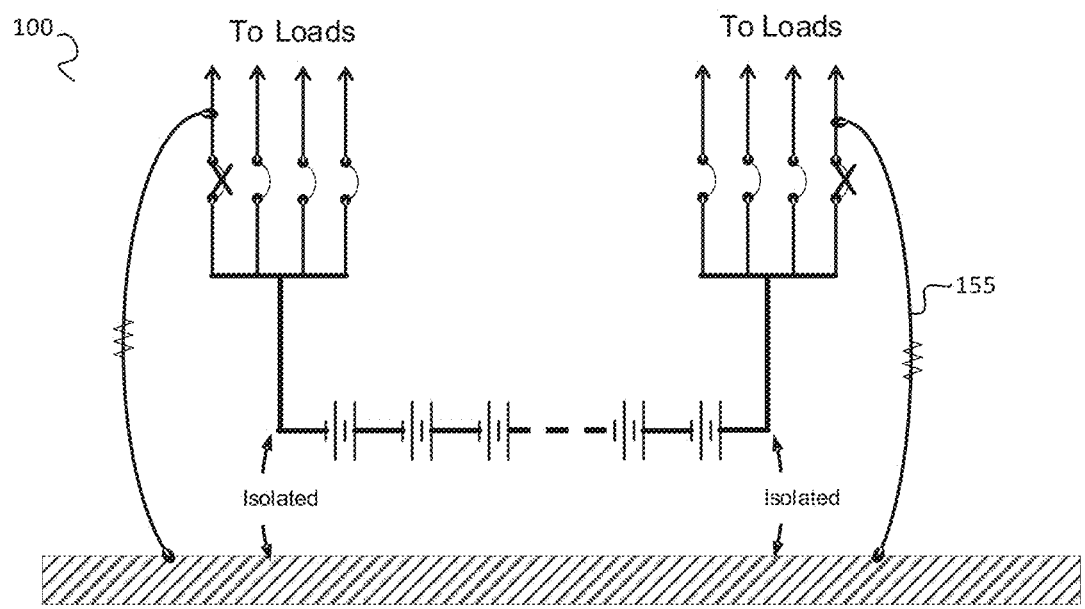

The battery string 110 provides power to connected loads via sub-circuits 131, 132, 133, 134, 135, 136, 137, 138. While eight sub-circuits 131, 132, 133, 134, 135, 136, 137, 138 are shown, this is not meant to be limiting, any number of sub-circuits may be powered by battery string 110. Sub-circuits 131, 132, 133, 134, 135, 136, 137, 138, include circuit breakers 141, 142, 143, 144, 145, 146, 147, 148. Other types of over current protection devices, e.g., fuses, may be used in place of circuit breakers 141, 142, 143, 144, 145, 146, 147, 148. Battery string 110 may be isolated from ground 120 to provide a level of fault tolerance, e.g., a single short to ground in one of sub-circuits 131, 132, 133, 134, 135, 136, 137, 138 will not cause a corresponding circuit breaker 141, 142, 143, 144, 145, 146, 147, 148 to trip. FIG. 1B depicts a first fault 150. The first fault 150 may be a short to ground 120 in sub-circuit 131. Because the battery string 110 is isolated from ground 120, the first fault 150 may not cause an interruption in power to the loads. FIG. 1C depicts a second fault 155. When the second fault 155 occurs, circuit breakers 141 and/or 148 may trip, removing power from loads connected to sub-circuits 131 and/or 138.

After a ground fault has occurred, e.g. first fault 150, it is desirable to determine the location of the fault and repair it. If the ground fault is not identified and repaired, the system is vulnerable to loss of power if a second ground fault, e.g., second fault 155, were to occur. Tracing the location of the ground fault may begin by measuring the DC voltage from each end of the battery string 110 to ground 120. With no fault present, the magnitude of the DC voltage measured at each end of the battery string 110 will be about the same. The magnitude of the DC voltage measured at each end of the battery string 110 should be approximately half of the battery string 110 total voltage. One side would be a positive voltage above ground while the other side would be a negative voltage below ground. However, if a fault is present, the magnitude of the DC voltage measured at the end of the battery string 110 that has the ground fault will be much lower.

Figure 2A:
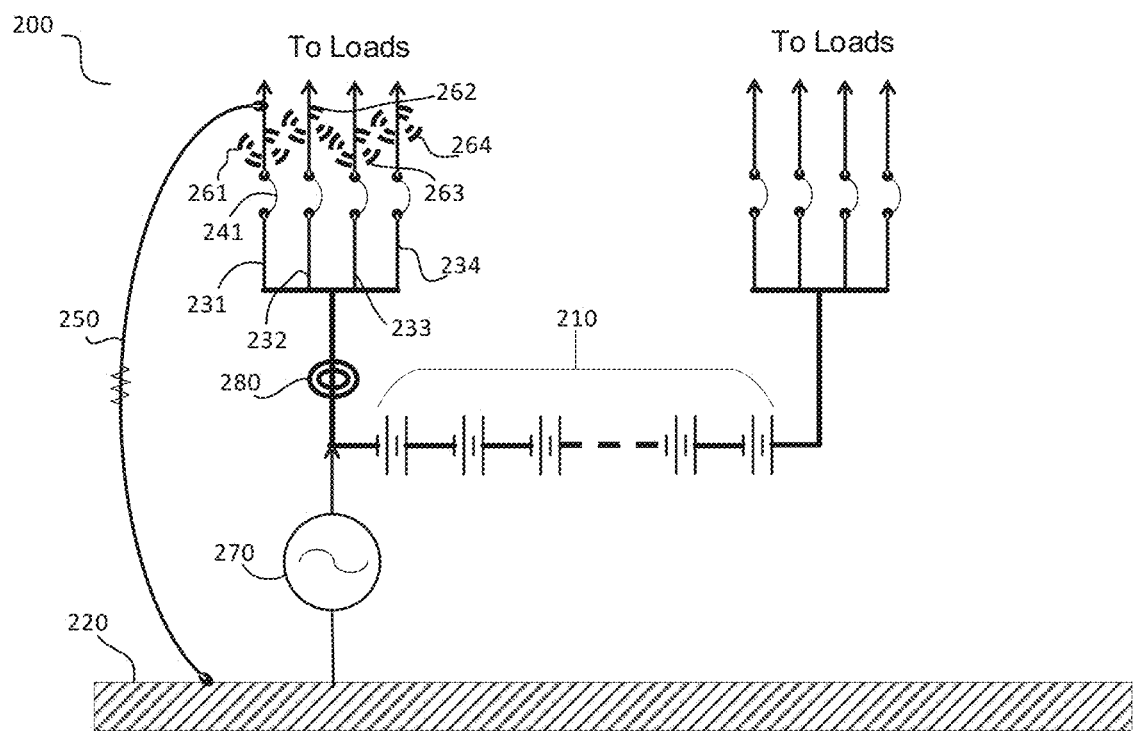
FIGS. 2A, 2B, and 2C are a diagram of several stages of ground fault detection.

FIG. 2A is a diagram of an embodiment of fault tracing in a battery backup circuit 200. A ground fault 250 is present on sub-circuit 231 between battery string 210 and ground 220. Because only a single ground fault 250 is present, circuit breaker 241 has not tripped. An AC excitation source 270 is connected between the end of the battery string 210 with the ground fault 250 and ground 220. Battery string 210 may be of a similar configuration as battery string 110. A split core current transformer is placed on the cable at location 280 on the end of the battery string 210 with the fault. Location 280 is on a cable before sub-circuits 231, 232, 233, 234 branch from the battery string 210. Sub-circuits 231, 232, 233, 234 may be substantially similar to sub-circuits 131, 132, 133, 134. The AC voltage from the AC excitation source 270 is increased until a stable current is measured by the current transformer at location 280. The current transformer is then moved to the various sub-circuits 231, 232, 233, 234 at location 261, 262, 263, 264 to determine which sub-circuit 231, 232, 233, 234 has the ground fault 250. The sub-circuit 231 with the ground fault 250 will complete a circuit formed by the AC excitation source 270 to ground 220. Because the other sub-circuits 232, 233, 234 are not shorted to ground, the circuit formed by the AC excitation source 270 to ground 220 would not be completed. After the sub-circuit 231 with the ground fault 250 is detected, the current transformer is then moved down the line of sub-circuit 231 toward the load (not pictured) in sub-circuit 231 to determine where along the line the ground fault 250 is located. The circuit formed by the AC excitation source 270 to ground 220 would not be completed beyond the location of the ground fault 250.

Figure 2B:
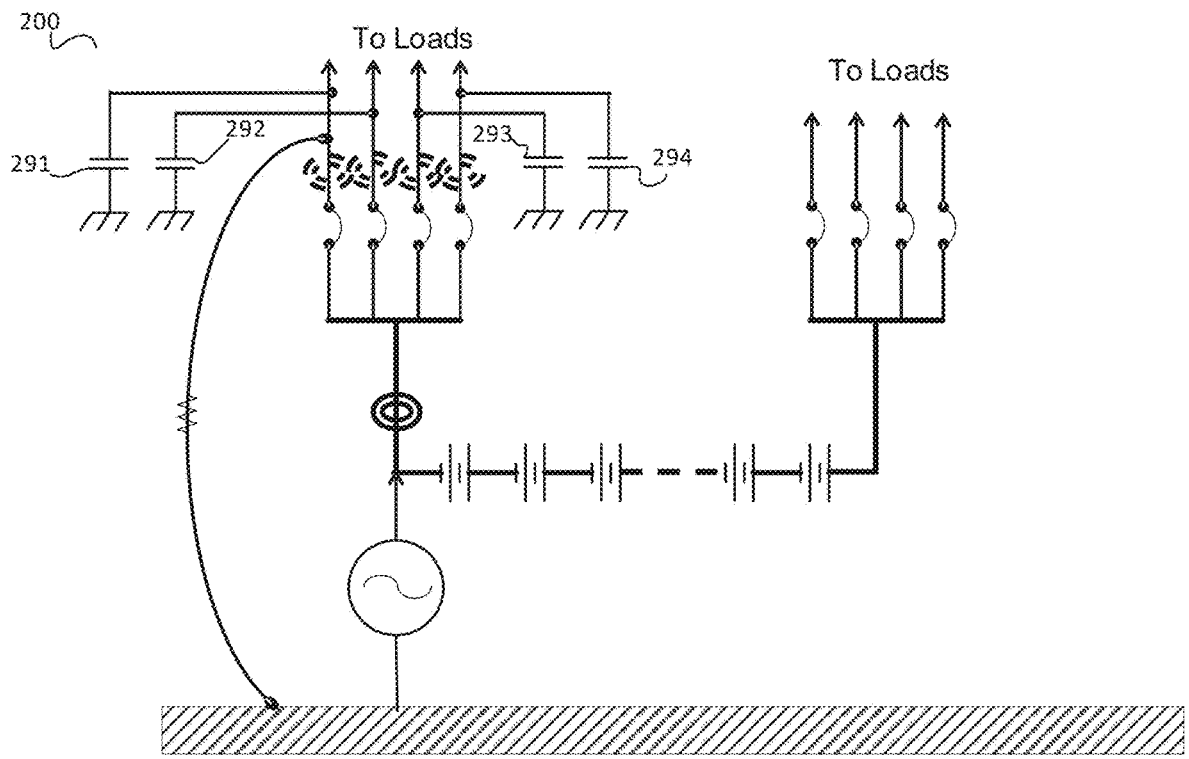

FIG. 2B identifies capacitance to ground characteristics of the battery backup circuit 200. During the fault tracing process, the presence of capacitance to ground 291, 292, 293, 294 on each of the sub-circuits 231, 232, 233, 234 may affect measurements. Some level of capacitance may be present whenever there are two conductors in close proximity, e.g., the conductor of sub-circuit 231 and ground 220, with a dielectric, e.g., insulation on the conductor of sub-circuit 231. The magnitude of the capacitance is influenced by the length of the conductor, the size of the conductor, the insulating material, and the proximity to ground. As a result of the various characteristics of the sub-circuits 231, 232, 233, 234, the normal capacitance to ground 220 of each sub-circuit 231, 232, 233, 234 may vary over a large range from nearly zero to 10 μfd or more.

In some cases, e.g., when the ground fault 250 to ground 220 is of high resistance, the current flow through the capacitance 291 may be greater in amplitude than the current through the ground fault 250. In these cases, it may be necessary to distinguish between the resistive component of the current and the capacitive component of the current. The fault location may be traced based upon the magnitude of the resistive component of the current.

Figure 2C:
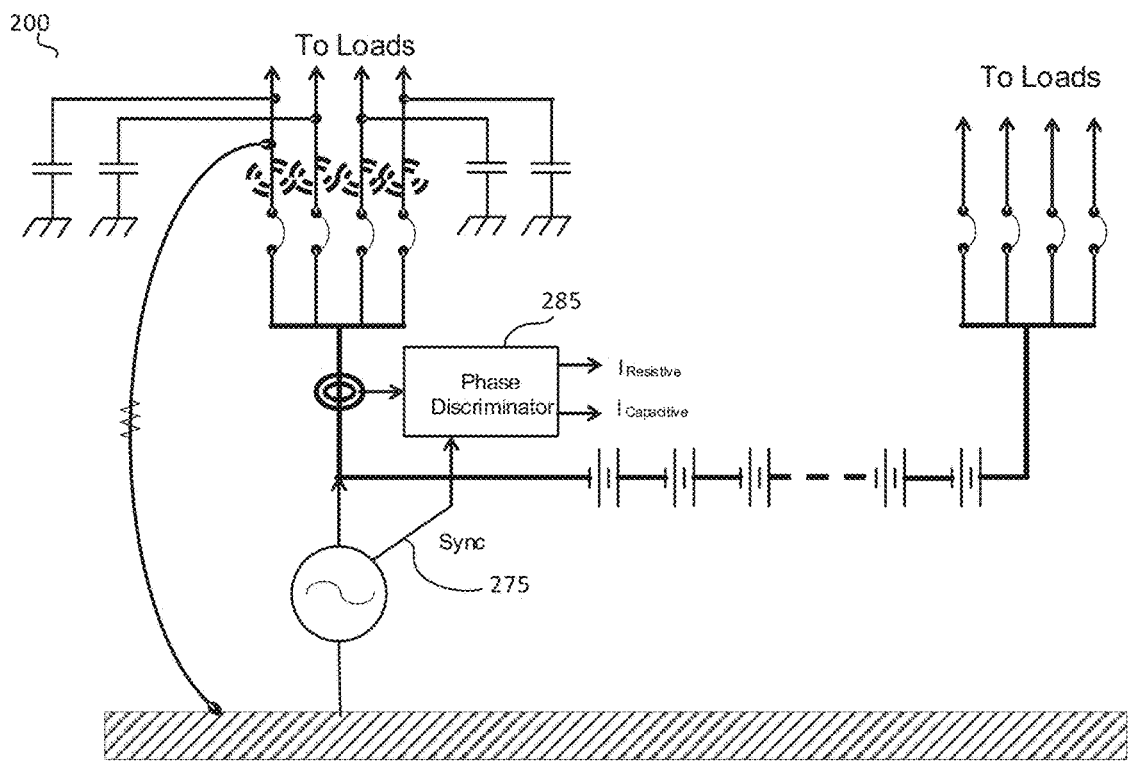

FIG. 2C is a diagram of an embodiment of the battery backup circuit 200 with a phase discriminator 285. The current sensed at the current transformer is broken into resistive and capacitive components based upon the phase of the current relative to the phase of the AC excitation signal applied by the AC excitation source 270. The resistive component of the current is in phase with the AC excitation signal and the capacitive component is 90° out of phase with the AC excitation signal. In order to determine the two components, the current sensed by the current transformer is applied to the phase discriminator 285. The phase discriminator 285 separates the signal into the resistive and capacitive components based upon a sync signal 275 from the AC power source 270. The sync signal 275 is a signal with the same frequency as the AC excitation signal applied to sub-circuit 231 by the AC excitation source 270 and has a known phase relative to the AC excitation signal.

The phase discriminator 285 works well when the current transformer is relatively close to the AC excitation source 275 as the sync signal 275 is provided via a wired interface. However, when tracing the location of the fault along one of the sub-circuits, the current transformer may be placed some distance down the line, e.g., at location 261. There may also be obstacles between the current transformer and the AC excitation source 270 making it impractical for the phase discriminator 285 to receive the sync signal 275 from the AC excitation source 270. For example, the wired interface becomes difficult to use if it is significantly more than 10 feet.

Figure 3:
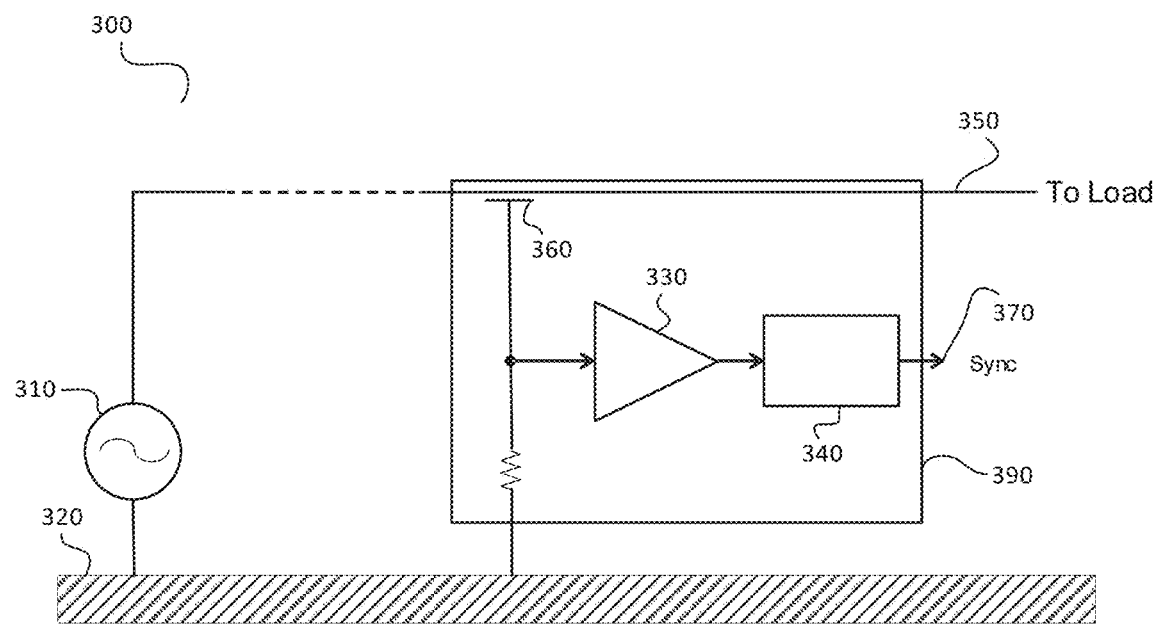
FIG. 3 is a diagram of an embodiment of a circuit comprising a capacitive pickup.

FIG. 3 is a diagram of an embodiment of a circuit 300 with capacitive pickup. A capacitive pickup may be used in situations where it is impractical to make a hardwired connection between an AC excitation source 310 and a phase discriminator, e.g., phase discriminator 285. AC excitation source 310 may be similar to AC excitation source 270. The AC excitation source 310 may be connected to ground 320 and line 350. A capacitive pickup 390 may be used to detect the AC voltage applied to the line 350. Line 350 may be an electrical conductor wrapped in an insulator or some other dielectric. Line 350 may be part of a sub-circuit under test, e.g. sub-circuit 231. AC voltage from AC excitation source 310 is on line 350, but is under a layer of insulation. A capacitive pickup 390 places a conductor (not pictured) against the line 350 being tested. The conductor may be any conductive material electrically connected to the buffer 330. A capacitor 360 is formed between the conductor of line 350 and the conductor placed against it, with the line's insulation acting as a capacitive dielectric. The detected signal is buffered in buffer 330 and filtered with a band-pass filter 340 whose passband is centered on the frequency of the AC excitation source 310. Both the frequency of the AC excitation source 310 and the passband of the band-pass filter 340 may be tunable. Tuning may occur at the time of manufacturing or other times as needed. The filtering attenuates high frequency noise that may be present while introducing a predictable, known phase shift to the sync signal. The resulting sync signal 370 is a sine wave of known phase relative to the AC excitation source 310. The sync signal can be used by a phase discriminator to separate the resistive and capacitive components of current from the current transformer signal. Thus, the capacitive pickup 390 provides a sync signal 370 without the need for a hardwired connection to the AC excitation source 310.

Figure 4:
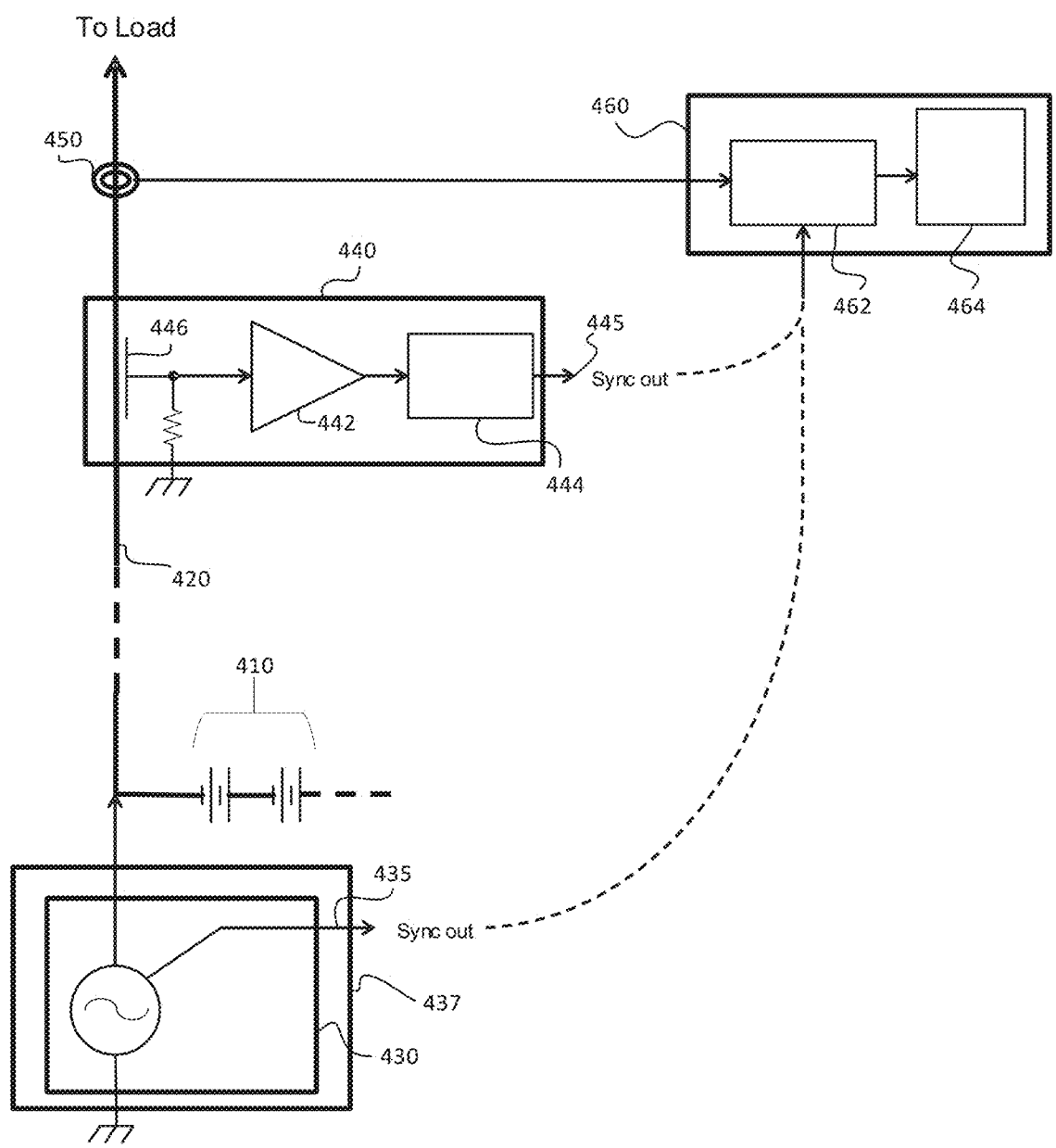
FIG. 4 is a diagram of an embodiment of ground fault detection using a capacitive pickup.

FIG. 4 is a diagram of an embodiment of fault detection using a capacitive pickup 440. Capacitive pickup 440 may function similarly to capacitive pickup 390 described in FIG. 3. After determining which side of the battery string 410, similar to battery strings 110 and 210, has the ground fault as described previously, the configuration in FIG. 4 may be used to determine the location of the ground fault. Wire 420 may be a conductor in a sub-circuit connected to battery string 410. Wire 420 may provide power to a connected load (not pictured). Wire 420 includes a conductive center portion with an insulator around the conductive center portion. After a ground fault occurs in the sub-circuit including wire 420, testing may occur to detect where the fault is located.

An AC excitation source 430, similar to AC excitation sources 270 and 310, may be connected to wire 420 on the end of battery string 410 where the fault is located. The AC excitation source 430 provides an AC test signal on wire 420. The AC excitation source 430 may also provide a sync signal 435 via a wired connection to a receiver 460. Sync signal 435 may be used to identify resistive and capacitive components of a signal detected on wire 420. The wired connection from the AC excitation source 430 may be used when the receiver 460 is in close proximity to the AC excitation source 430. For example, in the tens of feet. The AC excitation source 430 may be part of a transmitter 437. The transmitter 437 may include additional components and functionality not pictured. Transmitter 437 may be connected to both sides of battery string 410 in order to measure voltage to ground on each side of battery string 410 and identify which side is connected to a ground fault. Transmitter 437 may include controls to adjust the amplitude of the AC test signal output by the AC excitation source 430. The transmitter 437 may also include switches and/or relays to apply the AC test signal to the side of the battery string 410 that includes the ground fault without having to disconnect the transmitter 437 from the sides of the battery string 410, i.e., the connections (not pictured) from the transmitter 437 to each side of the battery string 410 may remain connected, but the AC test signal may only be applied the side of the battery string 410 with the ground fault. Further, the transmitter 437 may measure and display on a display the AC test signal amplitude, the measured AC test signal current, the calculated load resistance, and the calculated load capacitance. The transmitter 437 may include a processor and memory to control these operations.

Current transformer 450 may be placed on wire 420 to detect the AC test signal provided by the AC excitation source 430. The signal detected by the current transformer 450 is provided to the receiver 460 via a wired connection. The receiver 460 may use the sync signal 435 and the signal detected by the current transformer 450 to identify the resistive and capacitive components of the detected signal using a phase discriminator 462, similar to phase discriminator 285 above. The receiver 460 may then display the output of the phase discriminator 462 to include one or both of the resistive and capacitive components on display 464. Display 464 may include one or more LCD panels for displaying the resistive and capacitive components. The output of the phase discriminator 462 is used to determine whether the current transformer 450 is beyond the ground fault based on the magnitude of the resistive component of the detected signal. The receiver 460 may also use an audible alarm that sounds if the resistive component is above a selected threshold. The current transformer 450 is moved away from the AC power source 430 along wire 420 until the magnitude of the resistive component of the detected signal falls below a certain threshold. When the magnitude of the resistive component of the detected signal falls below the threshold, the fault to ground has been located. In some embodiments, when the resistive current drops by 50% or more, it may be determined that the ground fault has been located. As an example, the current transformer 450 may be moved along wire 420 at equal intervals until the resistive component falls below the threshold. It is then determined that the ground fault is in the previous interval. The current transformer 450 may then be moved in an opposite direction using smaller intervals until the resistive component is again detected above the threshold. This process can be repeated using successively smaller intervals until a precise location of the ground fault is detected. For example, the first interval size may be five feet, then reduced to one foot, then to several inches, thus the ground fault location may be determined down to several inches.

As current transformer 450 is moved further away from the AC excitation source 430, the receiver 460 is moved further away from the AC excitation source 430. Eventually a wired connection for sync signal 435 from the AC excitation source 430 to the receiver 460 becomes impractical, e.g., due to costs of the wire 420, signal degradation over the long transmission path, other obstructions, etc. In cases where a wired sync signal 435 is not provided to the receiver 460, a capacitive pickup 440, similar to capacitive pickup 390 described above, may be used to sense the AC test signal supplied by the AC excitation source 430 and provide a sync signal 445 for use by the receiver 460. The capacitive pickup 440 includes a conductor (not pictured) that is placed against wire 420 forming a capacitor 446 using the insulation of wire 420 as a capacitive dielectric. The signal sensed at the capacitor 446 is buffered by buffer 442 and filtered using band-pass filter 444. The passband of band-pass filter 444 may be selected to be centered on the AC test signal supplied by the AC excitation source 430. The output of the band-pass filter 444 is provided as sync signal 445 via a wired connection to receiver 460. The receiver 460 may use the sync signal 445 and the signal detected by the current transformer 450 to identify the resistive and capacitive components of the detected signal using the phase discriminator 462. The receiver 460 may then display the output of the phase discriminator 462 on display 464. The sync signal 435 provided by the AC excitation source 430 and the sync signal 445 produced by the capacitive pickup 440 may have the same relative phase to the AC excitation signal provided by the AC excitation source 430. The signal paths may be designed to produce this comparable phase relationship. Both the capacitive pickup 440 and the AC excitation source 430 may have factory calibration of the sync phase.

Figure 5A:
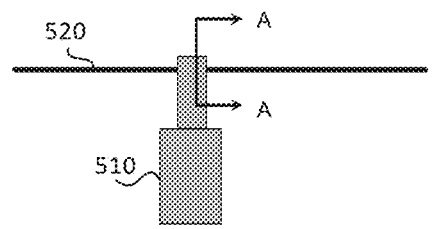
FIGS. 5A and 5B are views of an embodiment of a capacitive pick up coupled to a wire.
Figure 5B:
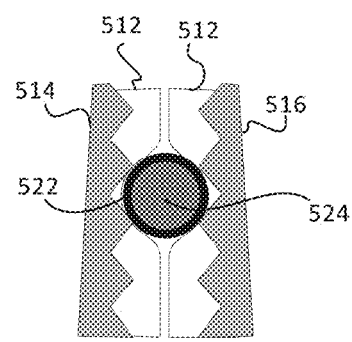

FIG. 5A is a diagram of an embodiment of a capacitive pickup 510, similar to capacitive pickup 390 and 440 above, coupled to a wire 520. FIG. 5B is a cross section AA of the capacitive pickup 510 coupled to a wire 520. Wire 520 includes a conductor 524 and an insulator 522 surrounding the conductor 524. Conductor 524 may be copper or some other conductive material. Insulator 522 may be plastic or some other non-conductive material. Capacitive pickup 510 includes jaws 514 516 lined with a conductor 512. Jaws 514 516 may be serrated to grip wire 520. Conductor 512 may include any conductive material, for example a conductive electromagnetic interference (EMI) gasket. Jaws 514 516 may be spring loaded such that they are closed while at rest. Thus, the jaws 514 516 may be compressed at an end to open and then released to close on wire 520. Insulator 522 acts as a dielectric between conductor 524 and conductor 512 resulting in a capacitor-like structure used to measure the voltage passing through wire 520 via conductor 524.

Figure 6A:
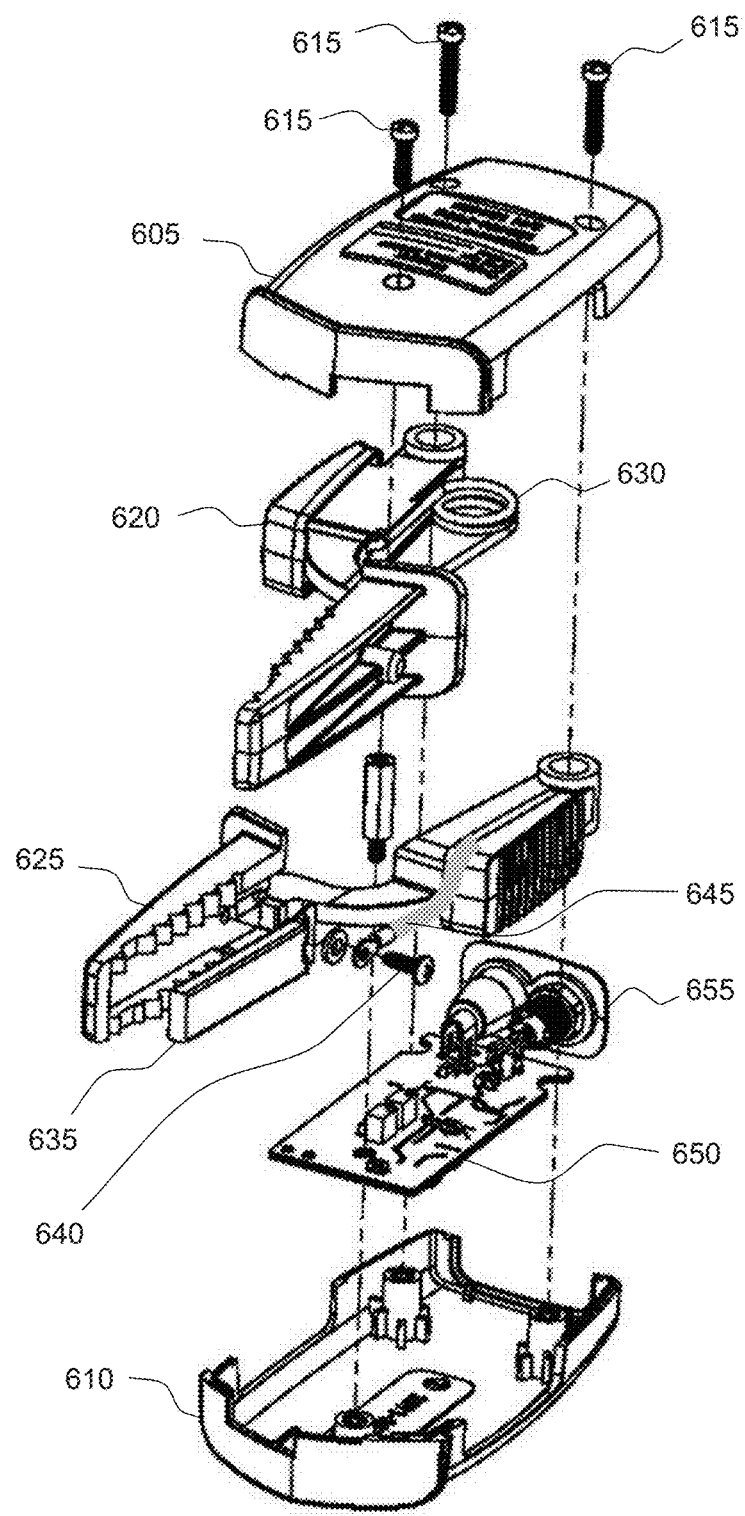
FIGS. 6A, 6B, and 6C are views of an embodiment of a capacitive pickup.
Figure 6B:
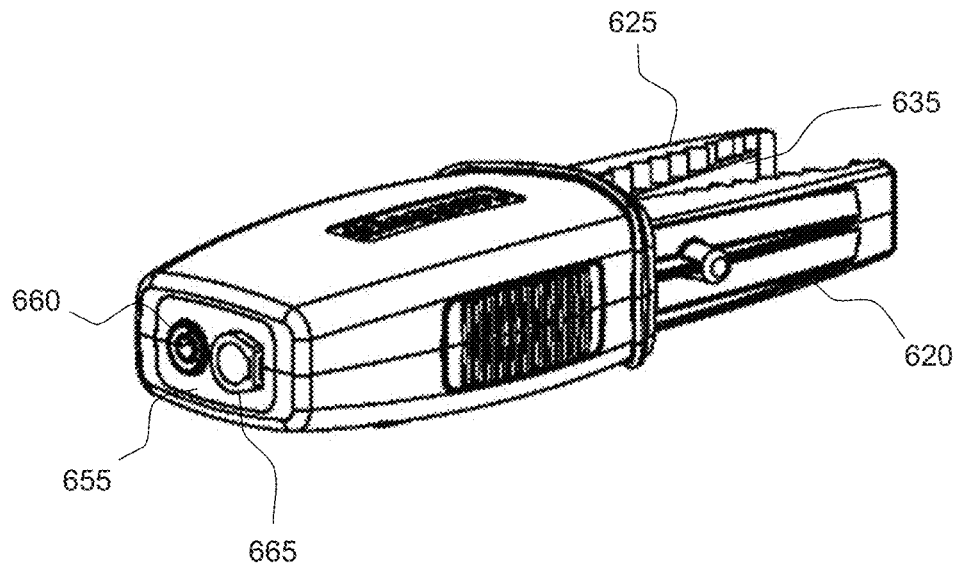
Figure 6C:
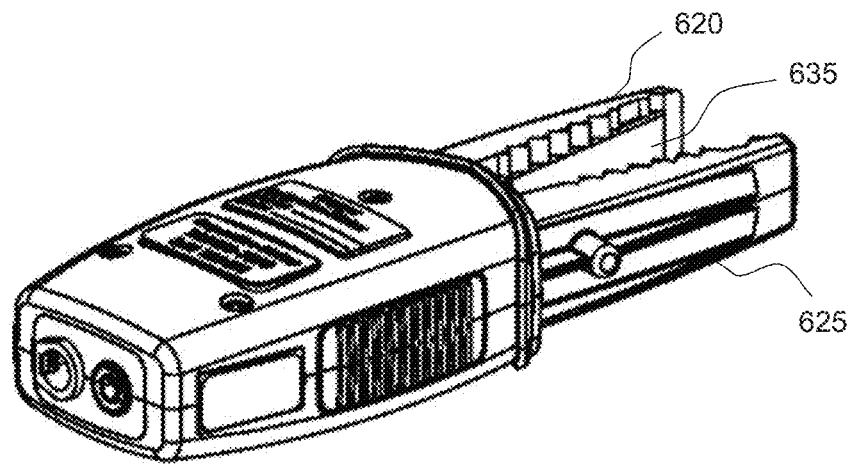

FIG. 6A is an exploded view of an embodiment of a capacitive pickup 600. FIG. 6B is a first isometric view of the capacitive pickup and FIG. 6C is a second isometric view of the capacitive pickup. The capacitive pickup 600 is similar to capacitive pickup 390, 440, 510 describes above. The capacitive pickup 600 is enclosed by an upper housing 605 and a lower housing 610. The upper housing 605 is secured to the lower housing 610 using screws 615. In other embodiments, other fastener types may be used, for example, rivets or sonic welds. The capacitive pickup includes jaws 620 625. Jaws 620 625 may be held closed by spring 630. Other objects used to store mechanical energy may be used in place of spring 630 such that jaws 620 625 remain closed while at rest. Jaws 620 625 are lined with a conductor 635. Conductor 635 may be any conductive material, for example a conductive EMI material. Conductor 635 may be made of a material that is flexible and will form a bond with greater surface area of the wire under test. Minimizing the air gap between a wire and conductor 635 and maximizing the contact surface area provides increased capacitance and improved measurements. Screw 640 may be used to attach conductor 635 to jaw 625. Likewise, a similar configuration may be used on jaw 625 to attach conductor 635. Conductor 635 may be attached to jaw 625 with other materials, for example adhesive. Screw 640 may also electrically couple wire 645 to conductor 635. Wire 645 is used to transmit a detected signal to circuit board 650. Circuit board 650 may include the components described above such as a buffer, a band-pass filter, and/or other electrical components necessary for measuring a voltage in a wire in proximity to conductor 635. A faceplate 655 may house connector 660 and connector 665. Leads from connector 660 and connector 665 may be electrically coupled to circuit board 650, for example by soldering. Connector 660 and connector 665 are used to output a signal indicative of a signal detected by the conductors 635. The output of connector 660 and connector 665 may be provided to a receiver, e.g., receiver 460, for analysis. Connector 665 may be used to make a connection to earth ground and connector 660 may be used for providing a sync signal to a receiver. Connector 660 may include a wire for transmitting the sync signal and a wire for DC power for the components of the capacitive pickup 600.

Figure 7:
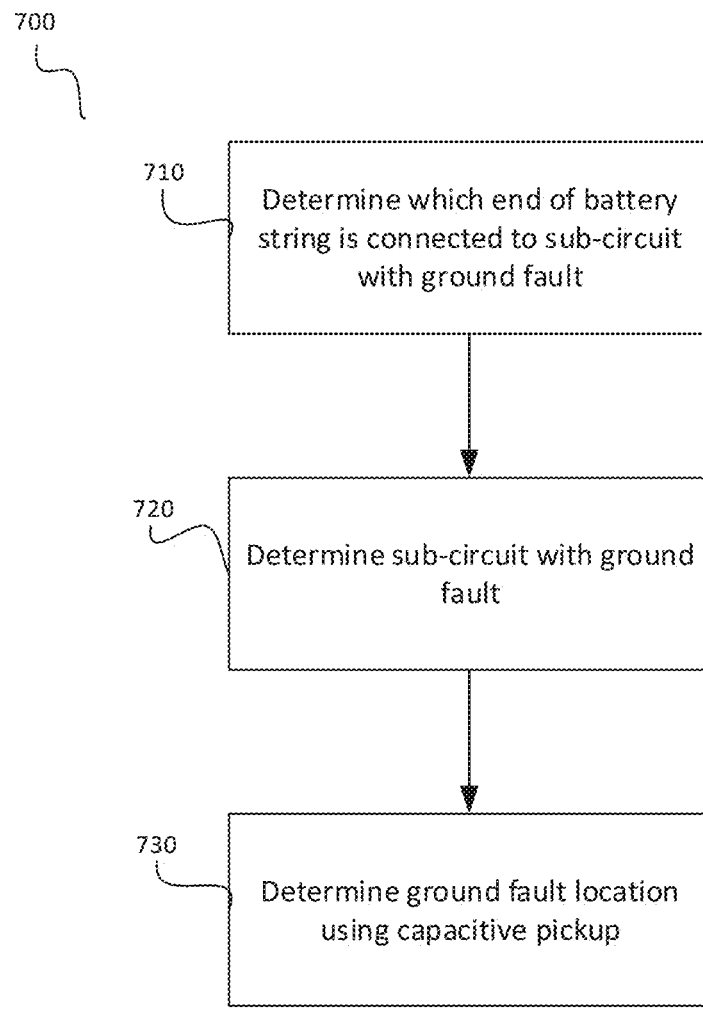
FIG. 7 is a flow diagram of an embodiment of a method for ground fault detection.

FIG. 7 is a flow diagram of an embodiment of a method 700 for ground fault detection. The method 700 begins at block 710 by determining which end of a battery string is closest to a ground fault. Determining which end of the battery string is closest to the fault may include measuring the voltage to ground at each end of the battery string. If the voltage is less than the expected voltage at one of the ends, then the end with the less than expected voltage is closest to the ground fault.

After determining which end of the battery string is closest to the ground fault, the method 700 continues at block 710 by determining which sub-circuit includes the ground fault. A number of sub-circuits may be connected in parallel to the end of the battery string. Determining which sub-circuit includes the ground fault may include connecting an AC excitation source to the end of the battery string closest to the ground fault prior to the branching of each of the sub-circuits. Next, a current transformer is connected to one of the sub-circuits to provide a detected signal to a receiver, e.g., receiver 460. A sync signal may be provided to the receiver from either the AC excitation source or a capacitive pickup, e.g., capacitive pickup 440. If the signal provided by the AC excitation source is detected on the sub-circuit, then the sub-circuit with the detected signal is providing a path to ground and thus includes the ground fault.

After determining which sub-circuit includes the ground fault, the method 700 continues at block 730 by determining the location of the ground fault using the capacitive pickup. The current transformer may be moved at intervals down the wire of the sub-circuit. At each interval the capacitive pickup may be connected to provide a sync signal to the receiver. The receiver may use the sync signal to distinguish the resistive component of the current detected by the current transformer. When the current transformer no longer detects the current, the ground fault is in the previous interval. The interval of movement of the current transformer may be reduced until a precise location of the fault is determined.

Figure 8:
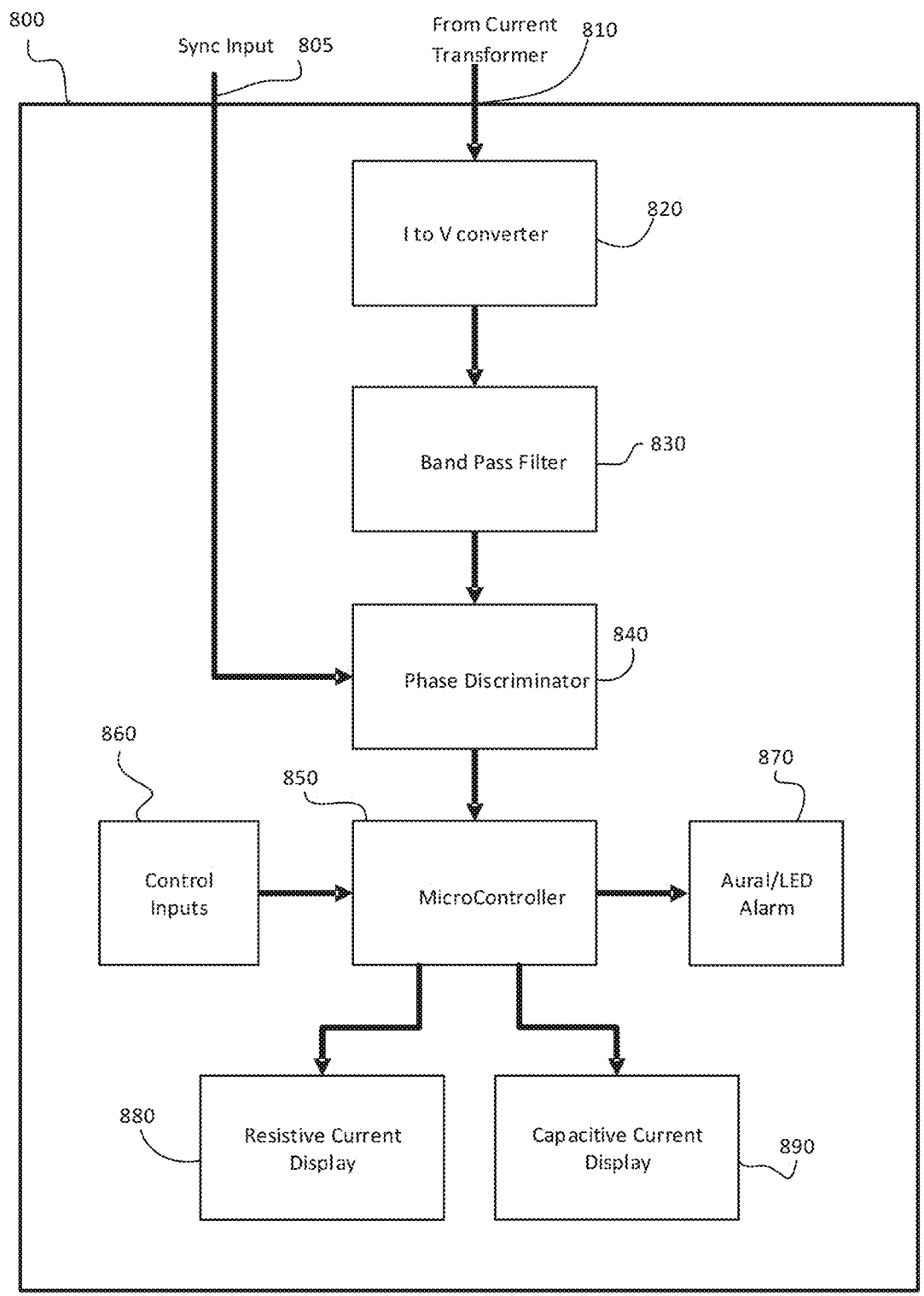
FIG. 8 is a diagram of an embodiment of a receiver device for ground fault detection.

FIG. 8 is a diagram of an embodiment of a receiver 800. Receiver 800 may perform functions similar to receiver 460. Receiver 800 is configured to receive a sync input 805 similar to sync signal 275, 370, 435, and 445. The sync input 805 may be received from an A/C excitation source, e.g., A/C excitation source 430 or a capacitive pickup, e.g., capacitive pickup 440. The sync input 805 is provided to phase discriminator 840. The receiver 800 is also configured to receive an input 810 from a current transformer, e.g., current transformer 450. The input 810 from the current transformer is provided to a current to voltage (I to V) converter 820. The I to V converter 820 converts the current of input 810 to a voltage usable by phase discriminator 840. The I to V converter 820 provides it's output signal to band-pass filter 830. The band-pass filter 830 is configured with a passband similar to the frequency of an excitation signal provided by the A/C excitation source. The band-pass filter 830 removes noise from the output signal of the I to V converter 820.

The phase discriminator 840 receives the sync input 805 and the signal output by the band-pass filter 830. The phase discriminator 840 uses the sync input 805 to separate the resistive and capacitive current data from the signal output by the band-pass filter 830. The resistive and capacitive current data is provided from the phase discriminator 840 to the microcontroller 850. The microcontroller 850 may include instructions that cause the microcontroller to process the resistive and capacitive current data and display numeric values of the magnitudes of the current components on resistive current display 880 and capacitive current display 890. The current values may be displayed in root-mean-square (RMS) values. Alternatively, a graph of the resistive and capacitive current components on resistive current may be displayed on resistive current display 880 and capacitive current display 890. The resistive current display 880 and capacitive current display 890 may be a single display or two separate displays on the receiver 800. The resistive current display 880 and capacitive current display 890 may be LCD or other display technologies. The microcontroller 850 may also be configured to trigger an indication 870 when a ground fault is located. The indication 870 may include any combination of an LED illuminating and/or an aural tone generated when the ground fault is located, when the resistive current is above or below a threshold. The microcontroller 850 is also configured to receive inputs 860 from one or more input control switches. The inputs 860 include one or more of a pushbutton switch to initiate storage of the measured resistive current level; a rotary switch to selects the relative alarm level (percent of stored value), e.g. threshold, and the alarming method of indication 870 e.g., no alarm, LED, aural, or LED and aural.

Figure 9:
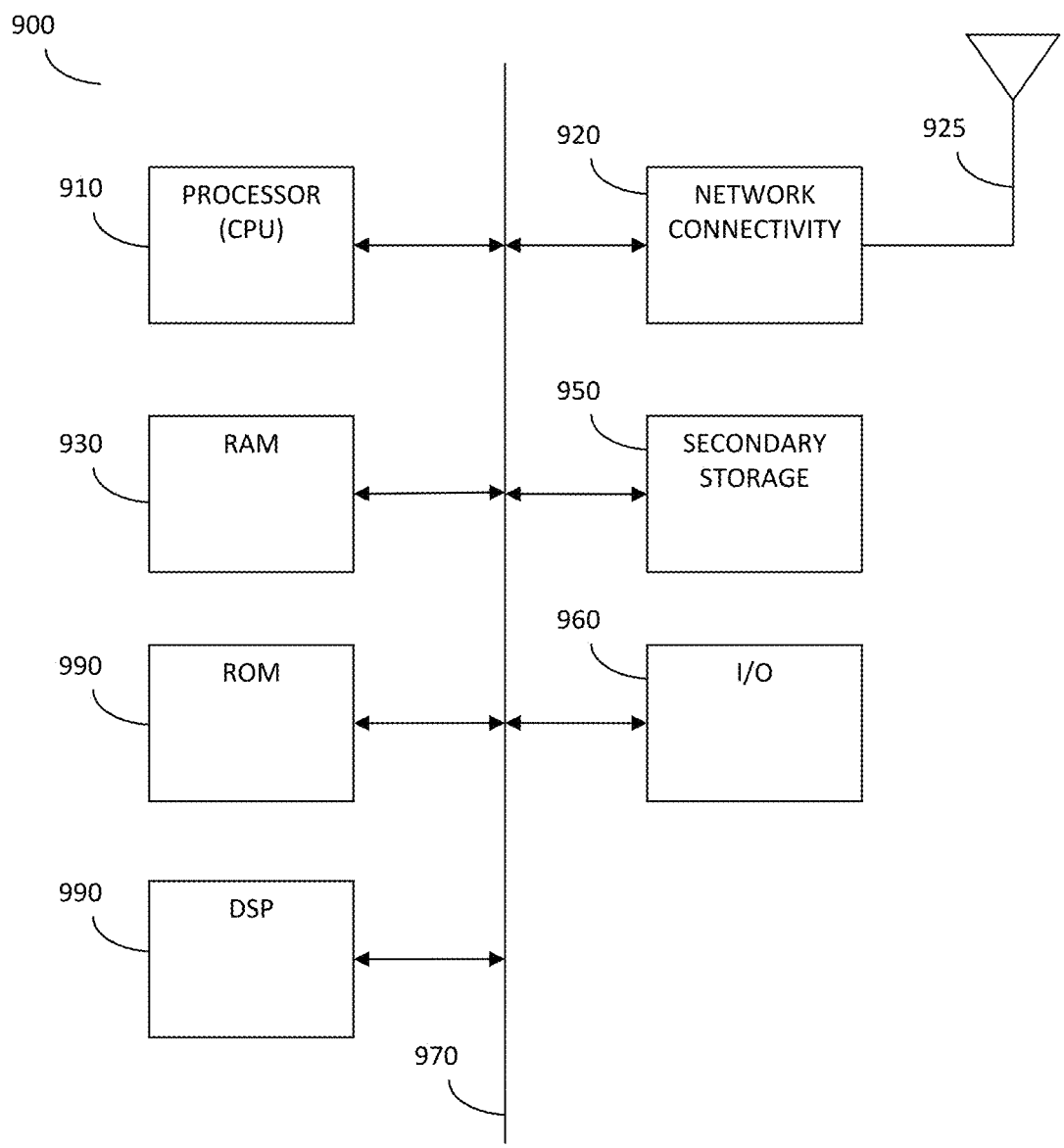
FIG. 9 is diagram of an embodiment of a device suitable for ground fault detection.

FIG. 9 is a diagram of an embodiment of a system 900 that includes a processor 910 suitable for implementing one or more embodiments disclosed herein, e.g., receiver 460 or 800 or transmitter 437. The processor 910 may control the overall operation of the system. In some embodiments, processor 910 may be a microcontroller including components described below, for example, RAM 930, ROM 980, and/or I/O 860.

In addition to the processor 910 (which may be referred to as a central processor unit or CPU), the system 900 might include network connectivity devices 920, random access memory (RAM) 930, read only memory (ROM) 940, secondary storage 950, and input/output (I/O) devices 960. These components might communicate with one another via a bus 970. In some cases, some of these components may not be present or may be combined in various combinations with one another or with other components not shown. These components might be located in a single physical entity or in more than one physical entity. Any actions described herein as being taken by the processor 910 might be taken by the processor 910 alone or by the processor 910 in conjunction with one or more components shown or not shown in the drawing, such as a digital signal processor (DSP) 980. Although the DSP 980 is shown as a separate component, the DSP 980 might be incorporated into the processor 910.

The processor 910 executes instructions, codes, computer programs, or scripts that it might access from the network connectivity devices 920, RAM 930, ROM 940, or secondary storage 950 (which might include various disk-based systems such as hard disk, floppy disk, or optical disk). While only one CPU 910 is shown, multiple processors may be present. Thus, while instructions may be discussed as being executed by a processor, the instructions may be executed simultaneously, serially, or otherwise by one or multiple processors. The processor 910 may be implemented as one or more CPU chips and may be a hardware device capable of executing computer instructions.

The network connectivity devices 920 may take the form of modems, modem banks, Ethernet devices, universal serial bus (USB) interface devices, serial interfaces, token ring devices, fiber distributed data interface (FDDI) devices, wireless local area network (WLAN) devices, radio transceiver devices such as code division multiple access (CDMA) devices, global system for mobile communications (GSM) radio transceiver devices, universal mobile telecommunications system (UMTS) radio transceiver devices, long term evolution (LTE) radio transceiver devices, worldwide interoperability for microwave access (WiMAX) devices, controller area network (CAN), domestic digital bus (D2B), and/or other well-known devices for connecting to networks. These network connectivity devices 920 may enable the processor 910 to communicate with the Internet or one or more telecommunications networks or other networks from which the processor 910 might receive information or to which the processor 910 might output information. The network connectivity devices 920 might also include one or more transceiver components 925 capable of transmitting and/or receiving data wirelessly.

The RAM 930 might be used to store volatile data and perhaps to store instructions that are executed by the processor 910. The ROM 940 is a non-volatile memory device that typically has a smaller memory capacity than the memory capacity of the secondary storage 950. ROM 940 might be used to store instructions and perhaps data that are read during execution of the instructions. Access to both RAM 930 and ROM 940 is typically faster than to secondary storage 950. The secondary storage 950 is typically comprised of one or more disk drives or tape drives and might be used for non-volatile storage of data or as an over-flow data storage device if RAM 930 is not large enough to hold all working data. Secondary storage 950 may be used to store programs that are loaded into RAM 930 when such programs are selected for execution.

The I/O devices 960 may include liquid crystal displays (LCDs), touch screen displays, keyboards, keypads, switches, dials, mice, track balls, voice recognizers, card readers, paper tape readers, printers, video monitors, electrical connectors, electrical excitation sources, electrical measurement devices, switching devices, relay devices, or other well-known input/output devices. Also, the transceiver 925 might be considered to be a component of the I/O devices 960 instead of or in addition to being a component of the network connectivity devices 920.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A system for ground fault detection comprising:
   an alternating current (AC) excitation source configured to provide an AC test signal to a circuit under test;
   a current transformer configured to detect a current of the AC test signal;
   a capacitive pickup configured to detect a voltage of the AC test signal; and
   a receiver comprising:
      a display; and
      a processor in communication with the display and configured to:
         receive the voltage from the capacitive pickup;
         receive the current from the current transformer; and
         display one or more components of the current on the display.

2. The system of claim 1, wherein the capacitive pickup comprises a conductor in contact with a wire of the circuit under test, and wherein the voltage is detected across a capacitor formed by a conductor of the wire, an insulating sheath of the wire, and the conductor of the capacitive pickup.

3. The system of claim 2, wherein the capacitive pickup further comprises a band-pass filter with a passband centered on a frequency of the AC test signal.

4. The system of claim 3, wherein the capacitive pickup further comprises a buffer configured to receive the voltage and output to the band-pass filter.

5. The system of claim 1, wherein the receiver comprises a phase discriminator configured to determine the one or more components of the current based on the voltage and the current.

6. The system of claim 5, wherein the one or more components of the current comprises a resistive component and a capacitive component.

7. The system of claim 1, wherein the AC excitation source is further configured to provide a sync signal to the receiver, and wherein the receiver is further configured to display on the display the one or more components of the current based on the sync signal and the current.

8. The system of claim 1, further comprising a transmitter comprising the AC excitation source and a voltage probe configured to measure voltage to ground on each side of the battery string in the circuit under test.

* * * * *